(12) United States Patent
Becker et al.

(10) Patent No.: US 6,911,348 B1
(45) Date of Patent: Jun. 28, 2005

(54) DEVICE AND METHOD FOR DETERMINING THE LATERAL UNDERCUT OF A STRUCTURED SURFACE LAYER

(75) Inventors: Volker Becker, Marxzell (DE); Franz Laermer, Stuttgart (DE); Andrea Schilp, Schwaebisch Gmuend (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/674,984
(22) PCT Filed: Mar. 13, 2000
(86) PCT No.: PCT/DE00/00749
§ 371 (c)(1), (2), (4) Date: Jan. 8, 2001
(87) PCT Pub. No.: WO00/55899
PCT Pub. Date: Sep. 21, 2000

(30) Foreign Application Priority Data

Mar. 12, 1999 (DE) ......................... 199 10 983

(51) Int. Cl.[7] .............................................. H01L 21/00
(52) U.S. Cl. ......................................... 438/10; 438/381
(58) Field of Search .............................. 438/5, 10, 381

(56) References Cited

U.S. PATENT DOCUMENTS

| | | | |
|---|---|---|---|
| 4,039,370 A | | 8/1977 | Kleinknecht |
| 5,126,284 A | * | 6/1992 | Curran ........................ 257/741 |
| 5,539,241 A | * | 7/1996 | Abidi et al. ................. 257/516 |
| 5,576,224 A | * | 11/1996 | Yakura et al. ............... 438/381 |
| 5,739,909 A | * | 4/1998 | Blayo et al. ................. 356/369 |
| 6,143,614 A | * | 11/2000 | Nasserbakht ................. 438/238 |

FOREIGN PATENT DOCUMENTS

DE 198 47 455 4/2000

OTHER PUBLICATIONS

Zincke et al., *Test Structure for Determining Design Rules for Microelectromechanial–Based Sensors and Actuators*, ICMTS, US, NY, IEEE, 1994.

* cited by examiner

*Primary Examiner*—W. David Coleman
(74) *Attorney, Agent, or Firm*—Kenyon & Kenyon

(57) ABSTRACT

A device and a method for determining the extent of an at least locally lateral undercut of a structured surface layer on a sacrificial layer. The structured surface layer for this purpose locally has at least one passive electronic component, using which a physical measured quantity can be determined, which is proportional to the extent of the lateral undercut. The method for generating this device proposes, initially on the structured surface layer in a first etching method, to provide the surface layer at least locally with a structuring having trenches and, in a second etching method, proceeding from the trenches, to undertake at least locally a lateral undercut of the structured surface layer. In this context, in the first etching method on the surface layer, locally at least one passive electronic component is additionally delineated out, which in response to a subsequent undercutting of the surface layer is also undercut. The physical measured quantity is determined without contact, preferably by sending an electromagnetic emission into the passive component.

27 Claims, 2 Drawing Sheets

DEVICE AND METHOD FOR DETERMINING THE LATERAL UNDERCUT OF A STRUCTURED SURFACE LAYER

FIELD OF THE INVENTION

The present invention relates to a device and a method for determining an at least local lateral undercut of a structured surface layer.

BACKGROUND INFORMATION

It is known to etch micromechanical surface structures in a silicon layer in hydrofluoride acid vapor and, to achieve an undercut of a structured surface layer of silicon, to apply a sacrificial layer of silicon dioxide under the surface layer to be structured. In this context, the hydrofluoride acid vapor, in etching the sacrificial layer, effects a purely time-controlled undercut of the structured surface layer, so that the specific undercut width achieved in the sacrificial layer, for example, to bring about the defined exposure of free-standing sensor structures in the surface layer, is not directly measurable in the course of the hydrofluoride acid vapor undercut, or cannot be monitored during the etching. Therefore, the permanent danger exists of inadvertently etching too briefly or too long. In particular, an etching lasting too long can lead to the destruction of structures on a wafer, for example, by detaching them from the substrate.

SUMMARY OF THE INVENTION

An object of the present invention, therefore, was to make available a method and a device suitable for carrying it out, which make it possible, in an ongoing way, to measure the achieved undercut width and the extent of the undercut of a structured surface layer, during the undercutting process.

In contrast to the related art, the method according to the present invention, along with the device according to the present invention, has the advantage that it makes it possible to determine the extent of the lateral undercut of a structured surface layer by etching a sacrificial layer, in an ongoing manner, in situ, i.e., during the undercutting, as a function of time, and therefore to be able to monitor and adjust the undercut.

For this purpose, at least one passive electronic component is delineated out from the surface layer, in some areas as a supplement, the component also being undercut when the surface layer is undercut and, in response to the undercutting, the component determining a physical measured quantity proportional to the extent of the undercut.

Thus it is very advantageous if the physical measured quantity is a capacitance, an absorbed or emitted intensity of an electromagnetic emission, an absorbed or emitted frequency, in particular a resonance frequency, or an absorbed or emitted frequency spectrum of an electromagnetic emission. In this context, it is advantageous if a first signal is emitted by at least one transmitter, the passive electronic component interacting with the first signal, a second signal being generated or the first signal being transformed into a second signal, which in turn is detected by at least one receiver. The physical measured quantity and thus the undercut proportional thereto are then determined from the second signal or from the difference between the first and the second signal.

In this context, the transmitter and receiver, in a very advantageous manner, are located outside the actual etching chamber and thus remain protected from etching corrosion, in particular, from aggressive etching gases such as hydrofluoride acid vapor, $ClF_3$, $XeF_2$, and the like. Thus, in a way that is also very advantageous, it is possible to do without a costly interconnecting and contacting of the passive electronic component. The interaction of the passive component and the transmitter or receiver thus takes place, advantageously, without contact.

Furthermore, it is particularly advantageous if the transmitter and receiver are integrated in one assembly, in particular a processing unit and/or the transmitter is also a receiver. In particular, in the latter case, characteristic electrical parameters of the transmitter, which react to changes in an electromagnetic radiation field, such as internal voltages, currents, or phases between internal voltages and currents, can very expediently be detected or evaluated in a simple manner.

Particularly suitable as a first signal is an electrical voltage coupled or applied to the passive electronic component; an irradiated or introduced intensity of an electromagnetic emission; (particularly advantageously) a high-frequency power output, irradiated or introduced into the passive electronic component, continuously or in pulses, the high-frequency power output having a preestablished frequency or preestablished frequency spectrum; or a sequence of chirped high-frequency pulses of an electromagnetic emission.

Similarly, it is advantageous if the second signal is also an electrical voltage, an absorbed or emitted intensity of an electromagnetic emission, an absorbed or emitted frequency, in particular, a resonance frequency, or a frequency spectrum of an electromagnetic emission.

Furthermore, it is particularly advantageous if the passive electronic component is a coil, additionally delineated out of the structured surface layer that is to be undercut at least locally, the coil, along with a base layer located underneath it, simultaneously forming a capacitor, in whose operation the sacrificial layer functions as a dielectric. Capacitance C of this capacitor is then proportional to the extent, to be determined, of the lateral undercut of the structured surface layer. The coil and the capacitor, formed on the basis of the coil and the base layer underneath it, thus represent an LC-oscillating circuit having a resonance frequency $f_0$, whose change $\Delta f_0$ is then proportional to the extent, to be determined, of the locally lateral undercut of the surface layer. In this context, at least one of the two coil ends of the coil, that is additionally delineated out as a passive electronic component, is advantageously dimensioned in its extension such that a complete undercut of the coil end does not occur. Therefore, the coil remains permanently attached to the base layer at least on one side and, for example, does not collapse.

Particularly suitable as material for the base layer is silicon or a silicon wafer. The surface layer is advantageously also made of silicon or polysilicon, which, for example, to improve the electrical properties, can be doped and/or metallized on the surface. Well-suited as the sacrificial layer, at least in the area of the passive electronic component and of the coil, is an electrically insulating material such as silicon oxide.

The method of the present invention is particularly well suited for a defined undercut, in particular in a vapor phase of hydrofluoride acid vapor or in a gas phase, for example, using $ClF_3$, $BrF_3$, or $XeF_2$, and thus for generating free-standing sensor structures in the structured surface layer. As a rule, the method is not suited for use in liquid etching media such as aqueous hydrofluoric acid, since, for example, the sending of a high-frequency emission into an electrolyte is difficult due to strong radiation damping.

DETAILED DESCRIPTION

Figure 1:
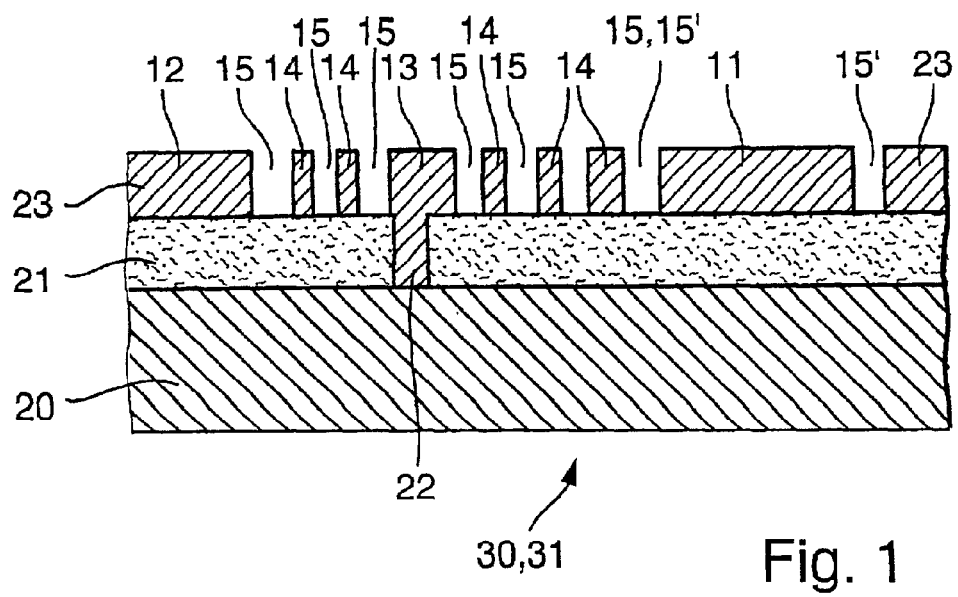
FIG. 1 depicts a cutaway view of a layer arrangement having a structured surface layer.

FIG. 1 depicts a layer arrangement having a structured surface layer 23, a sacrificial layer 21, and a base layer 20. Surface layer 23 is made of silicon or polysilicon, which is metallized on the surface, sacrificial layer 21 being made of silicon oxide, and base layer 20 being constituted by a silicon wafer. A design of this type has already been described, for example, in the German Published Patent Application 198 47 455. Furthermore, at least one passive electronic component 31 is locally delineated out from surface layer 23 in the form of a coil 30, coil 30 having a first coil end 13 and a second coil end 12 as well as coil windings 14, which are separated from each other via trenches 15, delineated out in surface layer 23 and extending in depth down to sacrificial layer 21. First coil end 13 is connected to base layer 20 via a plated through-hole 22, base layer 20 being electrically conductive. Coil 30 having inductance L thus constitutes, along with base layer 20, a capacitor having a capacitance C, sacrificial layer 21 functioning as dialectric.

Furthermore, at least one structure 11, to be undercut or exposed, is delineated out from structured surface layer 23 through trenches 15', trenches 15' also extending in depth down to sacrificial layer 21. In practice, a multiplicity of potentially different structures 11 are delineated out from surface layer 23, whereas a few passive electronic components 31 at most are usually sufficient to determine the extent of the lateral undercut. The shape of structure 11, in this context, is not subjected to any limitation. In this context, it can be a structure 11, to be exposed, in the shape of a micro oscillating mirror, a sensor, or only an area of surface layer 23. In particular, structure 11, in this context, does not have to be surrounded by trenches 15', it rather being sufficient if a lateral undercut of structure 11 is made possible by only one trench 15', which, for example, can also be configured as a hole.

Figure 2:
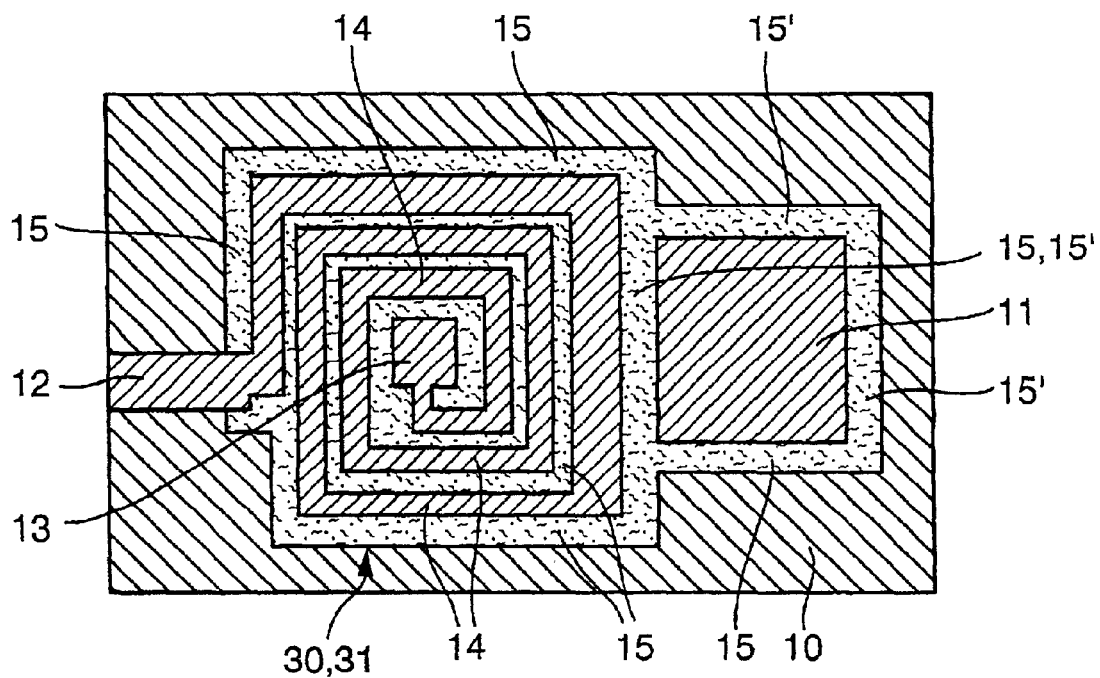
FIG. 2 depicts a top view of FIG. 1.

FIG. 2 depicts a top view of FIG. 1, coil 30 in this case being located, by way of example, in the immediate vicinity of structure 11, and structure 11 being a plate 11 to be undercut completely or partially, the extent of the undercut being determined with the assistance of passive electronic component 31, i.e., coil 30. In addition, first and second coil ends 12, 13 are, in each case, configured so as to cover a large surface opposite coil windings 14, in order to avoid a complete undercut of at least one of coil ends 12 or 13. The dimensioning of coil ends 12, 13, the number of coil windings 14, the width of trenches 15 and 15', and the shape of coil 30, which is executed in FIG. 2 in the shape of a right-angle meander only for purposes of illustration, follow, in the individual case, from the lateral extent of the undercut, to be determined. With respect to these variables, FIGS. 1 through 3 should not be understood as providing a standard. In particular, the windings of coil 30 can also be configured in a spiral shape, the surfaces occupied by coil ends 12, 13 can be significantly larger than the surface of structure 11, and the width of trenches 15 can be comparable to the width of structure 11. The suitable dimensioning of the individual components can be stipulated by the worker skilled in the art in the concrete case, on the basis of simple reflections and trials. In this context, the dimensioning also depends, for example, on the frequency range in which the work is to be done.

Figure 3:
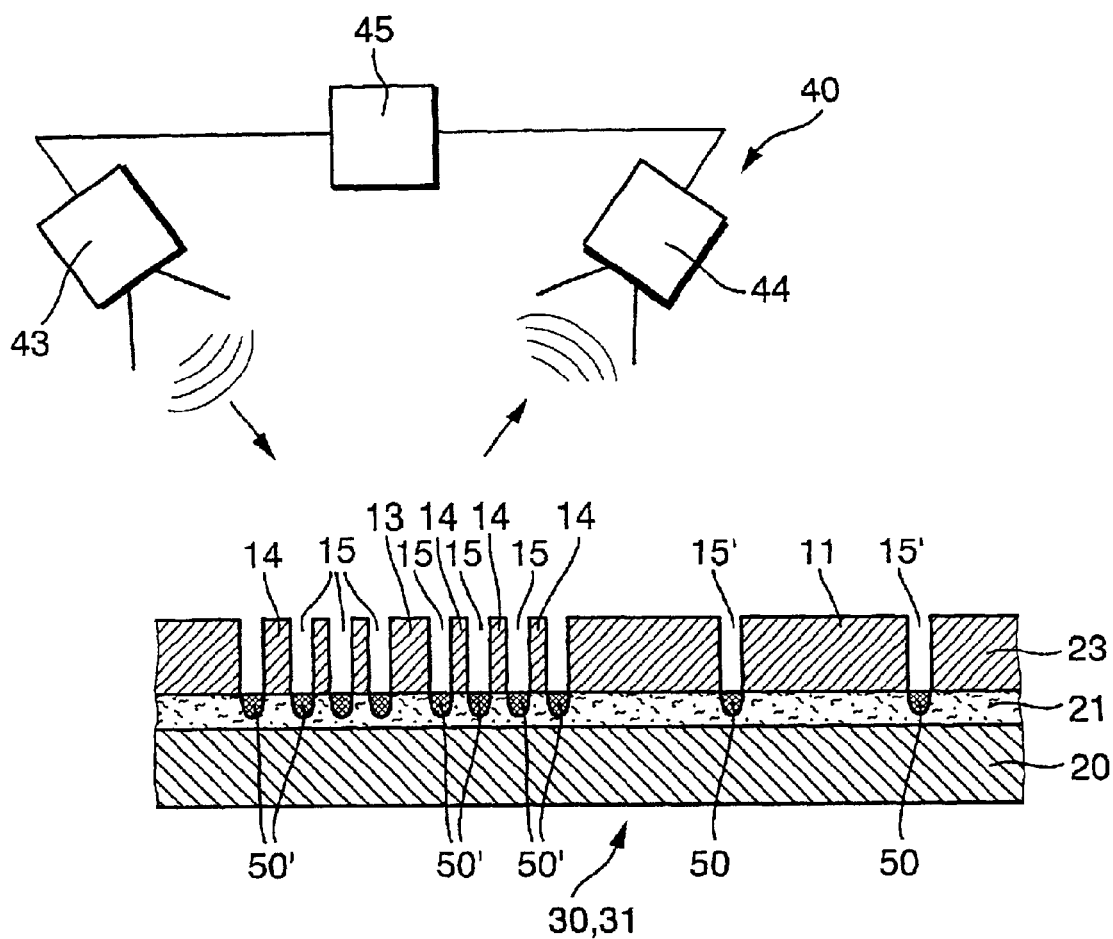
FIG. 3 depicts a further specific embodiment of the layer arrangement according to FIG. 1 having supplemental external assemblies.

FIG. 3 depicts one refinement of FIG. 1 having further external assemblies. In this context, a first signal is emitted from external transmitter 43, the first signal interacting with passive electronic component 31, i.e., coil 30, and as a result, the first signal is transformed into a second signal, or a second signal is emitted. Receiver 44 then receives this second signal. In this context, transmitter 43 and receiver 44 can operate either continuously (simultaneously transmitting and receiving) or alternately (alternately transmitting and receiving). Furthermore, a correlator 45 is provided, which determines the physical measured quantity in a generally known manner from the second signal or from the difference between the first and the second signal. In FIG. 3, accordingly, transmitter 43, receiver 44, and correlator 45 constitute a processing unit 40, which sits outside the silicon wafer and interacts via electromagnetic emissions, without contact, with coil 30 and with the oscillating circuit formed by coil 30 and base layer 20. Processing unit 40 can therefore also be arranged outside the actual etching installation and, there, is not exposed in particular to the corrosion of an aggressive etching medium. Therefore, an interconnection with coil 30 is not necessary.

In FIG. 3, the manner is also indicated in which an undercut of structured surface layer 23, through the etching of sacrificial layer 21, emerges from etching areas 50 and 50' at the base of trenches 15, 15', for example, in a well-known manner, in hydrofluoric acid vapor.

Specifically, in the exemplary embodiment discussed according to FIG. 1, a silicon dioxide layer is first applied as sacrificial layer 21 on a silicon wafer, which functions as a base layer 20. On this sacrificial layer 21, a surface layer 23 made of silicon or polysilicon is then applied, which is metallized on the surface. Subsequently, surface layer 23, in a generally known manner, is structured using a masking, and trenches 15 and 15' are etched into surface layer 23, which extend in depth down to sacrificial layer 21. Trenches 15', in this context, surround at least one structure 11, to be undercut and especially to be exposed. At the same time, using the etching process for structuring surface layer 23, one or a plurality of passive electronic components 31, in the form of a coil 30, is etched into surface layer 23 and is delineated out from it, so that a plurality of coil windings 14 is executed in the silicon of surface layer 23, which are arranged on the same sacrificial oxide type, i.e., the same sacrificial layer 21, as structures 11 to be exposed.

First coil end 13 or second coil end 12 of coil 30 can also be electrically connected to base layer 20 using a plated through-hole 22 in the form of a contact hole (see FIG. 1). Alternatively, at least one of the two coil ends 12, 13 can also be widened to the point that it is dependably not entirely undercut during the undercutting of structure 11 to be exposed, so that coil 30 remains attached, at least on one side, on sacrificial layer 21 (see FIG. 3). Furthermore, it is also possible to widen both coil ends 12, 13, so that neither is completely undercut during the undercutting. In the event that one of coil ends 12, 13 is not widened and is completely undercut in the undercutting of structure 11, to be exposed, it is also possible to retain a construction of coil 30 that is self-supporting after the termination of the undercutting, if the respective other coil end is widened or, as is particularly preferred, it is connected to base layer 20 by a plated through-hole 22. A combination of a widened coil end along with a coil end connected to base layer 20 via a plated through-hole 22 has proven to be particularly expedient.

A capacitor having capacitance C distributed over the length of coil windings 14 is formed, in the direction of base layer 20, by the arrangement of coil windings 14, having the silicon oxide of sacrificial layer 21 underneath. Coil 30, as an electrical conductor, at the same time has an inductance L, so that in any case an oscillating circuit arises whose resonance frequency $f_0$, as a result of inductance L and capacitance C, is given as $$f_0 = \frac{1}{\sqrt{LC}} * \frac{1}{2\pi}.$$

In one preferred embodiment, the surface of surface layer 23 in the area of coil 30 is metallized, for example, using aluminum, AlSiCu, or AlSi, this metallization also being able to function as a contact material for structure 11. As a result of the metallization, the ohmic resistance of coil windings 14 is significantly reduced and, therefore, the highest possible resonance quality of the generated LC oscillating circuit is achieved. Thus a sharp definition of the resonance frequency of the generated oscillating circuit is assured through high resonance quality, on the basis of minimal electrical damping.

On the basis of the relative permittivity of silicon dioxide $\epsilon_{oxide}$ of 3.88 in comparison to that of air $\epsilon_{air}$ of 1, capacitance C of capacitor diminishes in proportion to the degree that sacrificial layer 21 under coil 30, or coil ends 14 and/or 13, is etched away through a lateral undercut in hydrofluoric acid vapor and, in this context, is replaced by air or hydrofluoric acid vapor. Sacrificial layer 21 as a dielectric thus constantly changes its effective relative permittivity during the undercutting, the effective relative permittivity generated as a function of the undercut being proportional to the lateral extent of the undercut of coil 30. For the changing of capacitance C of the capacitor formed by coil 30 and base layer 20, the following applies:

$$C = \varepsilon \varepsilon_0 \frac{A}{d} \text{ and } \Delta C = \varepsilon_0 \frac{\Delta A}{d}(\varepsilon_{oxide} - 1).$$

In this context, $\Delta A$ designates the surface of sacrificial layer 21 removed by the undercutting under coil 30 and d designates the distance between coil 30 and base layer 20, i.e., the thickness of originally existing sacrificial layer 21.

The measured lateral extent of the undercut of coil 30 is therefore a measure for the lateral extent of the undercut of structure 11.

The change of capacitance $\Delta C$ of the oscillating circuit is in turn very precisely measurable through change $\Delta f_0$ of resonance frequency $f_0$ of the LC oscillating circuit, the following being valid in the first approximation:

$$\Delta f_0 = -\frac{1}{2} \frac{\Delta C}{C} f_0.$$

In this context, the metrological recording of resonance frequency $f_0$ of the oscillating circuit or its change $\Delta f_0$, in response to progressive undercutting, can take place in a multitude of well-known ways. Particularly suitable is the resonant absorption and reradiation of an irradiated or introduced high-frequency emission. For this purpose, for example, in accordance with FIG. 3, using a so-called "grid-dipper" as processing unit 40, a high-frequency emission, in hydrofluoric acid vapor, is emitted into the etching device used for this purpose during the undercutting, the frequency position of the etching device being varied manually or automatically. In the case of automatic variation, the terms "frequency sweep" or "wobbling" are used. In the resonance case, i.e., if the frequency applied or irradiated from outside coincides with the resonance frequency of the oscillating circuit, the oscillating circuit then effects a change of least one characteristic electrical or physical measured quantity, which is detected. Thus a resonance absorption by passive electronic component 31, i.e., by the LC oscillating circuit formed from coil 30 and base layer 20, from an external high-frequency radiation field on the emitter side, i.e., in transmitter 43, results in a change in voltages, currents, or phases between currents and voltages, which can be detected as measured quantities in transmitter 43 itself. Well-suited for this purpose is, for example, the grid current of an oscillator valve (electron valve) functioning as a high-frequency generator generating the irradiated or introduced high-frequency emission, the term "grid dipper" for this measuring device deriving therefrom, since the grid current of an oscillator valve of this type breaks (dips) in a very measurable way in the case of resonance with regard to an external oscillating circuit.

However, corresponding electrical quantities also arise in the case of transistor oscillators, if an external oscillating circuit is met in a resonant fashion by the irradiated high frequency emission and, in this context, if it takes on energy from the radiation field. Apparent in the exemplary embodiments discussed is always the change in the radiation field brought about by a resonance absorption, which can then be detected in a multiplicity of well-known ways and, for example, can be precisely determined with respect to frequency.

A further exemplary embodiment, particularly for determining the resonance frequency of the oscillating circuit, provides for emitting into the oscillating circuit formed on the basis of coil 30 so-called "chirped" high-frequency pulses from transmitter 43 of processing unit 40 in accordance with FIG. 3, i.e., high-frequency pulses, whose frequency rapidly changes in accordance with a preestablished time function (for example, linear). In this context, the chirped high-frequency pulse, having its covered high-frequency range, also covers the resonance frequency of the oscillating circuit formed, so that the latter for the duration of the emitted pulse is at some point excited in a resonant manner. After every chirped high-frequency pulse, in a transmission pause, the emission of electromagnetic radiation through the oscillating circuit is measured ("echo") by receiver 44 and the value of the emitted resonance frequency, i.e., of the resonance frequency of the oscillating circuit, which in turn is proportional to the lateral undercut to be determined, is measured using a standard frequency measuring method.

In a further exemplary embodiment, in an alteration of the exemplary embodiment discussed above, instead of a sequence of chirped high-frequency pulses, a sequence of broadband noise pulses is emitted from transmitter 43 to the surface of surface layer 23, i.e., pulses from a statistical frequency mix that includes the resonance frequency of the oscillating circuit formed on the basis of coil 30, delineated out on the silicon wafer. At the end of every noise pulse, in a transmission pause, the high-frequency output (the "echo") emitted by the LC oscillating circuit, as described above, is then detected by receiver 44 and is evaluated in processing unit 40 with respect to its frequency. The oscillating circuit during the emission therefore takes on energy as soon as it is struck in its resonance frequency, energy that it subsequently emits once again on this frequency. During the pulse pauses, the re-emission ("echo") is particularly easy to detect because no strong transmission signal is superimposed.

In this exemplary embodiment, the resonance frequency or the change of the resonance frequency of the oscillating circuit as a physical measured quantity is also proportional to the extent, to be determined, of the lateral undercut.

Finally, it is also possible to emit a broadband noise spectrum continuously via transmitter 43 and to continuously detect it using transmitter 44. Since the emission of the LC oscillating circuit takes place in a narrow band around its resonance frequency, the superimposed transmission signal in this case can be reliably and simply separated from the emission of the LC oscillating circuit and can be identified.

Obviously, in addition to the resonance frequency of the oscillating circuit, an intensity, absorbed or emitted from the oscillating circuit, of an electromagnetic emission or a phase change in the radiation field, as a function of the undercut, are also suitable as physical measured quantities.

What is claimed is:

1. A device for determining an extent of an at least locally etched lateral undercut of a structured surface layer on a sacrificial layer, comprising:
at least one passive electronic component arranged on the structured surface layer and in the shape of a coil, the at least one passive electronic component configured to determine a physical measured quantity that is proportional to the extent of the at least locally etched lateral undercut of the structured surface layer on the sacrificial layer.

2. The device according to claim 1, wherein the physical measured quantity corresponds to one of:
a capacitance,
one of an absorbed intensity and an emitted intensity of an electromagnetic emission,
one of an absorbed frequency and an emitted frequency, and
one of an absorbed frequency spectrum and an emitted frequency spectrum of the electromagnetic emission.

3. The device according to claim 2, wherein:
the one of the absorbed frequency and the emitted frequency corresponds to a resonance frequency.

4. The device according to claim 1, further comprising:
at least one transmitter for emitting a first signal;
at least one receiver for detecting a second signal, the at least one passive electronic component interacting with the first signal and one of generating the second signal and transforming the first signal into the second signal.

5. The device according to claim 4, wherein the physical measured quantity is determined from one of:
the second signal, and
a difference between the first signal and the second signal.

6. The device according to claim 4, wherein:
the at least one transmitter and the at least one receiver are integrated in an assembly.

7. The device according to claim 6, wherein:
the assembly includes a processing unit.

8. The device according to claim 4, wherein:
the at least one transmitter is at the same time also the at least one receiver.

9. The device according to claim 4, wherein:
the first signal includes one of:
a first voltage applied to the at least one passive electronic component,
an intensity of an electromagnetic emission,
a high-frequency power output that is emitted one of continuously and in pulses and emitted into the at least one passive electronic component, the high-frequency power output having one of a preestablished frequency and a preestablished frequency spectrum, and
a sequence of one of chirped high-frequency pulses and broadband noise pulses of the electromagnetic emission, and
the second signal includes one of:
a second voltage,
one of an absorbed intensity and an emitted intensity of the electromagnetic emission, and
one of a frequency and a frequency spectrum of the electromagnetic emission.

10. The device according to claim 9, wherein:
the frequency of the electromagnetic emission corresponds to a resonance frequency.

11. The device according to claim 1, wherein:
the coil delineated out in the structured surface layer includes a first coil end and a second coil end,
the coil and a base layer arranged with respect to the structured surface layer and the sacrificial layer form a capacitor having a capacitance proportional to the extent of the lateral undercut.

12. The device according to claim 11, wherein:
the coil forms an oscillating circuit having a resonance frequency $f_0$, and
a change $\Delta f_0$ is proportional to the extent of the lateral undercut.

13. The device according to claim 11, wherein:
a plated through-hole extends through the sacrificial layer,
the plated-through hole connects one of the first coil end and the second coil end to the base layer.

14. The device according to claim 11, wherein:
at least one of the first coil end and the second coil end is dimensioned in an extent thereof such that a complete undercut of the at least one of the first coil end and the second coil end does not occur.

15. The device according to claim 1, wherein:
the structured surface layer, at least in an area of the at least one passive electronic component, is separated from a base layer by the sacrificial layer.

16. The device according to claim 15, wherein a structure of the base layer corresponds to one of:
a material including one of silicon and polysilicon, and
a silicon wafer.

17. The device according to claim 1, wherein:
the structured surface layer, at least in an area of the at least one passive electronic component, is at least weakly electrically conductive and is composed of one of silicon, polysilicon, a surface-metallized silicon, a doped silicon, a surface-metallized polysilicon, and a doped polysilicon.

18. The device according to claim 1, wherein:
the sacrificial layer, at least in an area of the at least one passive electronic component, is electrically insulating and includes a silicon oxide layer.

19. The device according to claim 1, wherein:
the structured surface layer includes trenches that extend in depth down to the sacrificial layer.

20. The device according to claim 19, wherein:
the trenches border a structure, to be undercut, in the structured surface layer.

21. A method for determining an extent of a lateral undercut of a structured surface layer on a sacrificial layer, comprising the steps of:

performing a first etching operation to provide at least locally to the structured surface layer a structure including trenches, wherein the first etching operation includes the step of:
  locally additionally delineating at least one passive electronic component out of the structured surface layer;
  performing a second etching operation that begins from the trenches and generates at least locally the lateral undercut of the structured surface layer;
  undercutting the at least one passive electronic component in response to the undercutting of the structured surface layer; and
  in response to the undercutting of at least one of the structured surface layer and the at least one passive electronic component, causing the at least one passive electronic component to determine a physical measured quantity proportional to the extent of the lateral undercut.

22. The method according to claim 21, wherein:
the step of performing the first etching operation occurs through a masking.

23. The method according to claim 21, further comprising the step of:
applying the sacrificial layer on a base layer.

24. The method according to claim 21, wherein:
the step of delineating occurs through an etching of the trenches.

25. The method according to claim 21, further comprising the step of:
  delineating a coil out of the structured surface layer as the at least one passive electronic component.

26. The method according to claim 25, further comprising the steps of:
  in response to an undercut of the coil, measuring a resonance frequency of an oscillating circuit formed on the basis of the coil; and
  determining from the resonance frequency the extent of the lateral undercut.

27. A device for determining an extent of an at least locally etched lateral undercut of a structured surface layer, comprising:
  a sacrificial layer having trenches to form the at least locally etched lateral undercut of the structured surface; and
  at least one passive electronic component arranged on the structured surface layer and in the shape of a coil, the at least one passive electronic component configured to determine a physical measured quantity that is proportional to the extent of the at least locally etched lateral undercut of the structured surface layer on the sacrificial layer.

* * * * *